United States Patent [19]
Rauf

[11] Patent Number: 5,325,068
[45] Date of Patent: Jun. 28, 1994

[54] TEST SYSTEM FOR MEASUREMENTS OF INSULATION RESISTANCE

[76] Inventor: Abdul Rauf, 226 Frontenac Rd., New Kensington, Pa. 15068

[21] Appl. No.: 914,203

[22] Filed: Jul. 14, 1992

[51] Int. Cl.$^5$ ............................................. G01R 27/14
[52] U.S. Cl. ................................... 324/713; 324/73.1
[58] Field of Search .............. 324/551, 557, 713, 73.1, 324/540, 541, 717, 718

[56] References Cited

U.S. PATENT DOCUMENTS 2,923,879  2/1960  Povey ................................. 324/551

FOREIGN PATENT DOCUMENTS 1504630  8/1989  U.S.S.R. ............................. 324/551

*Primary Examiner*—Walter E. Snow
*Attorney, Agent, or Firm*—Clifford A. Poff

[57] ABSTRACT

The electrical resistance of specimens formed on test coupons is measured by a method and apparatus in which a test voltage applied to each specimen yields a leakage current. An operational amplifier having very high impedance inputs receives the leakage current signal and generates an output voltage that is very low in magnitude and varies in the leakage current. The test voltage is applied to a plurality of specimens and leakage current from each specimen is simultaneously converted by operational amplifiers whose very low impedance outputs are applied through switches in a sequential fashion to an analog to digital converter whose output is fed to a central processing unit wherein the leakage current is computer in terms of the resistance of the electrical insulation under examination.

18 Claims, 3 Drawing Sheets

TEST SYSTEM FOR MEASUREMENTS OF INSULATION RESISTANCE

BACKGROUND OF THE INVENTION

1. Field of the Invention

This invention relates to a method and apparatus for measuring the resistance offered by insulating members to an impressed voltage tending to produce a leakage current through or on the surface of the members. More particularly the present invention relates to conductively coupling each of a plurality of insulation specimens between a high voltage test potential and individual ones of a plurality of converters having inputs receiving the leakage current and outputs that are selected by multiplex switching and varies in response to the leakage current; the outputs are characterized by a low voltage signal which is interrogated by analog switching without introducing erroneous electrical influences to the electrical signals used for determining the resistance measurement of the insulation specimen.

2. Description of the Prior Art

While not so limited, the present invention is particularly applicable to measuring the leakage of current through or on the surface of insulating members of a component or a part of a electrical device particularly a circuit board. Surface insulation resistance testing, per se known in the art, is a test that yields data giving a measure of the cleanliness of the circuit board after wave solder and conformal coating and a wash process. Surface insulation resistance testing has become increasing important because the use of CFC (e.g. freon) to clean circuit boards has been prohibited to protect the environment. Residues that are both ionic and non-ionic have a direct impact on surface insulation resistance and long term reliability of a circuit board assembly.

There are numerous testing methods known to be established in various industries depending on the established criteria by users or others. Factors affecting insulation resistance measurements include temperature, humidity, residual charge, charging currents, time constant of the instrument and measuring circuit, test voltage, previous conditioning, and duration of uninterrupted test voltage application (sometimes called electrification time). The electrification time involves the lowering of current from an instantaneous high value to a steady state lower value at a rate dependent upon the factors such as test voltage, temperature, insulating materials, capacitance and external circuit resistance. The measurement of insulation resistance will increase for an appreciable time as test voltage is applied uninterruptedly. Therefore, it may take minutes to approach maximum insulation resistance readings but it is usually required that readings occur after a specified time of usually one or more minutes. The tests for the resistance of a dielectric surface are carried out by forming parallel lines of conductors bounding the dielectric circuit.

Test patterns may be created having different line spacings, line widths and lengths of conductor lines. Such test patterns are commonly referred to as a test coupon particularly when the test pattern is formed as an integral part of a circuit board and utilized during the fabrication of the circuit board to carry out the testing of a dielectric surface. To measure the resistance of surface insulation, a resistor on the test coupon comprised of a dielectric surface between parallel conductors is connected in a test circuit such that current flows from a voltage source through the resistor by applying the voltage source to one conductor and connecting the other conductor an input lead joined with ammeter or electrometer to measure the current. The current measurement is then utilized according to ohms law to calculate the insulation resistance, namely, the insulation resistance is equal to the applied voltage divided by the measured current across the resistor. When such a testing procedure is carried out manually, it is laborious task that is highly accessible to human error and electrical interference. Usually the test method is not reliable because it is not reproducible and highly operator dependent. Moreover, the exact location of the megohmmeter in the measuring circuit has an effect on the reading of the electrical current.

Other effects to the megohmmeter reading include electrostatic interference due to the temperature in the environment in which the test is carried out as well as the humidity and even a movement of personnel about the test site. When multiple samples must be tested, for example, automated testing is usually performed and requires a high voltage DC source which is supplied to one of the conductors for the resistor of each of the test coupons and an ammeter, megohmmeter or electro meter coupled to the second conductor of each of the resistor. Since multiple specimens are to be tested, the specimens are connected through a multiplexer relays to the meter. The output from the meter is supplied to a computer or microprocessor used to not only control the relays, but also display the test results.

Automated test systems have disadvantages that include cross-channel leakage which limits the test range, accuracy and repeatability of the tests. Many accepted test methods in industry require that the sample be biased at a predetermined DC voltage, for example 48 volts or 100 volts, for a predetermined period, usually a number of hours and then biased at a test voltage of 100 or 500 volts DC which is applied for a period of one or more minutes before the actual measurement of the insulation resistance is carried out. A serious deficiency of this automated test method occurs when the test voltage, for example 500 volts DC, is applied to all the channels of the sample at the same time. Cross-channel leakage and leakage of the relay open contacts results in a degrading of the accuracy of measurement to such an extent that reliable measurements can not be obtained.

Moreover, when the high voltage supply is exposed to a short circuit because a test coupon forms the short circuit or the coupon has such a low insulation resistance that it can short the high voltage supply, then the voltage across the remaining coupons is reduced to such an extent that it is impossible to measure with any accuracy the insulation resistance. To avoid this shortcoming, known available automatic test systems operate by applying a test voltage of some pre-determined level of direct current to only one sample for one or more minutes after which a measurement is made and after the measurement the test voltage is applied to the next sample for the specified period of time following which a measurement is made. Thus, the samples are tested sequentially, one at a time. This renders the time for testing the samples unduly excessive. For example, when the number of samples to undergo a test is 100 then the obtaining of a single set of data for all the samples will require at least 1.5 hours and up to 3 hours.

Moreover, when each test specimen undergoes numerous test cycles, the testing process is not only lengthy but very tedious requiring the accumulation of data in an orderly fashion in order to render the test meaningful and useful. In addition to the consumption of an inordinate amount of time to complete the test, the accuracy although carried out in a unitary test specimen fashion is subject to greatly varying errors. A test channel although an unused but adjacent to a test channel during a testing operation has a normal characteristic of the open relay of a resistance of $10^{10}$ ohms. This normal resistance of the unused open relay adds to the inaccuracy of the measurement to the insulation resistance which can vary from $10^6$ to $10^{12}$ ohms or more. The problem of inaccuracy is particularly acute when a test specimen takes the form of a four segmented comb pattern where the open relays of an adjacent coupon channel are charged electrically by the leakage current of a shorted coupon thus causing more inaccuracies to the measurement.

In a testing procedure for a circuit board, for example, it is common place to expose the circuit board to conditions which ages the materials through environmental conditions as well as electrical potential applied to test coupons. During the aging process, it is desirable to obtain measurements of the insulation resistance properties to the materials of the circuit board with known existing measuring methods and apparatus. Such a monitoring process of the materials would not be feasible because of the time required, for example, to complete a single set of test measurements where a large number of test specimens must be used. Thus, repetitive measurements of a large number of test specimens could not be completed in a sufficient time cycle to yield meaningful information about the aging process.

Accordingly, it is an object of the present invention to provide an improved method and apparatus for measuring electrical resistance of insulation wherein a low leakage current which is a function of surface insulation resistance is converted to a voltage in a circuit before a measurement is undertaken. A measurement signal is converted from a high source voltage (test voltage) and high source impedance (insulation resistance of specimen) to such a low magnitude of source voltage (output voltage of the converter e.g. an operational amplifier) and low source impedance (output impedance of the converter) so as to have no influence on the leakage from an open relay or switch contact that is used to multiplex the low voltage representing leakage current to the measuring device. The operational amplifier as a converter is chosen such that it has a very high input impedance and a very low output impedance.

A further object of the present invention is to provide a method and apparatus for measuring low leakage current from the surface of insulation wherein an applied test voltage to the insulation surface occurs through a serial arrangement of resistors between the high voltage supply and each of a plurality of test coupons, there being for each test coupon a discrete resistor to limit the current of a test voltage in the event a test coupon is shorted so that the measurement of the remainder of the test coupons remains unaffected by the shunt formed by the short.

Another object of the present invention to provide a method and apparatus for measuring low leakage current of surface insulation wherein the leakage current from an applied voltage from the insulation resistance is coupled to a converter wherein the leakage current is converted to a voltage by transformation from a high source impedance circuit i.e., the high voltage test circuit to a low source impedance circuit i.e., the output from the converter so that the low voltage, low impedance circuit operates with relay contacts therein in a manner to render leakage current due to open relay or analog switch negligible. The multiplexed output signal is advantageously fed to a measuring circuit to obtain insulation resistance value of the specimen under test.

It is a further object of the present invention to provide the method and apparatus for measuring the electrical resistance of insulation wherein a high test voltage is applied to a test specimen of such insulation for the purpose of measurement of leakage current and at other times while the test specimen is exposed to atmospheric conditions and/or applied voltages during which the test specimen may also be monitored for leakage current by the same circuitry utilized to monitor the leakage current of an applied high test voltage.

SUMMARY OF THE INVENTION

More particularly to the present invention there is provided a method for measurement the electrical resistance of insulation in which the method includes the steps of electrically coupling each of a plurality of electrical insulation specimens to a test voltage and individually to one of a plurality of convertors for producing voltage outputs that vary in response to leakage current inputs whereby a voltage appearing at the output of a given converter varies as a function of the leakage current by the test specimen coupled thereto, switching the outputs of the plurality convertors, and establishing from the switched voltage output from each convertor the leakage current of the respective specimen.

The present invention further provides an apparatus for measuring the electrical resistance of specimens of electrical insulation wherein the apparatus includes means for applying a high voltage electrical potential to each of a plurality of test specimens, a convertor electrically coupled to each one of a plurality of the test specimens for generating an output voltage signal that varies in response to a leakage current input, a switch for the output of each of the converters to allow individual measurement of each output voltage signal, and means responsive to each switched output voltage signal from each switch for establishing a leakage current measurement for the respective specimens.

In both the method and apparatus of the present invention there is preferably further provided that the applied high test voltage potential is coupled to each test specimen to an individual resistor so that a short across any given test specimen will not adversely affect concurrent measurements taken of another test specimen in the high voltage circuit. Advantageously, the measurement voltage signals are interrogated sequentially by multiplexing analog switches.

BRIEF DESCRIPTION OF THE DRAWINGS

The present invention will be more fully understood when read in light of the accompanying drawings in which.

DESCRIPTION OF THE PREFERRED EMBODIMENT

Figure 1:
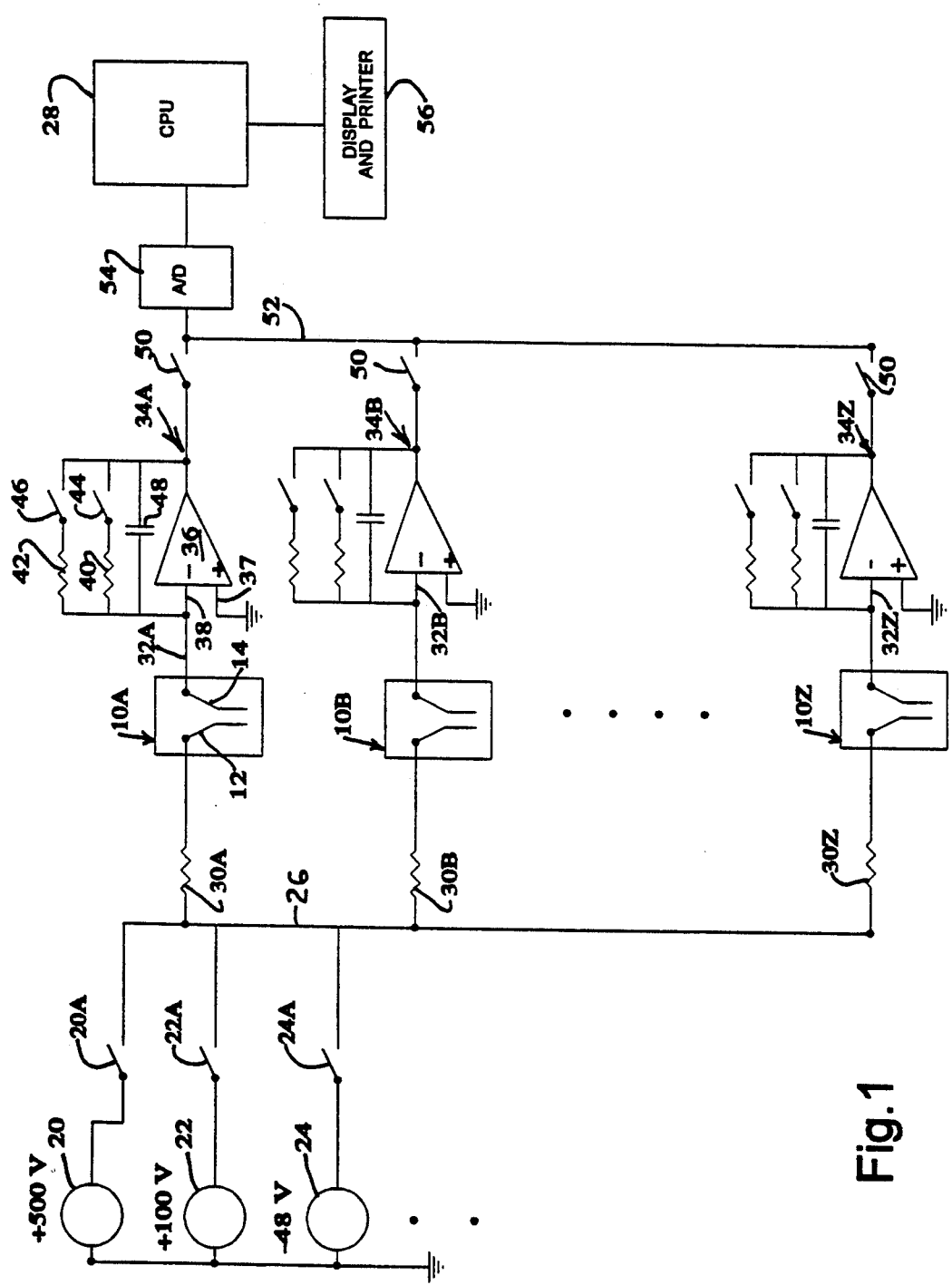
FIG. 1 is a schematic illustration of a preferred embodiment of circuitry or electrical resistant measurements.
Figure 2:
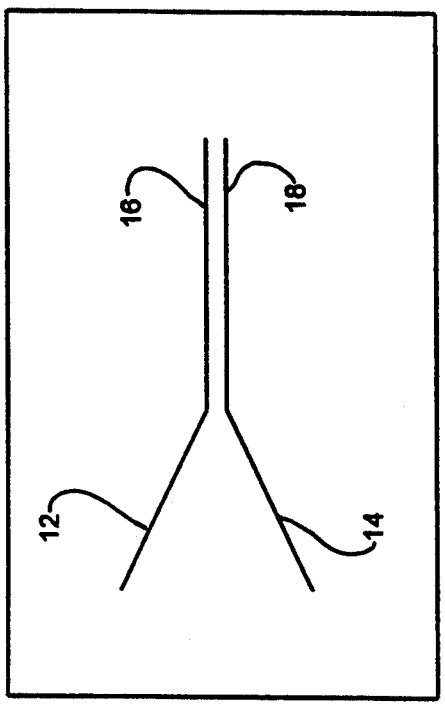
FIG. 2 is an illustration of a simplified test coupon to carry out the electrical measurements according to the circuit of FIG. 1.

In FIG. 1 there is illustrated the preferred embodiment of electrical circuitry for carrying out the present invention. In this embodiment, test coupons of the type shown in FIG. 2 are connected in the electrical circuitry. The test coupons are identified by reference numeral 10A, 10B ... 10Z. As shown in FIG. 2 the test coupon has conductor leads 12 and 14 arranged in a "Y" configuration form sites where electrical leads are connected to form inputs for a test voltage. The leads 12 and 14 extend to a conductive pattern comprised of a parallel arrangement of conductors 16 and 18 having between them a quantity of electrical resistance material under investigation by measurements of the electrical resistance properties. It is to be understood that the test pattern of the configuration shown in FIG. 2, may be formed on a given circuit board at each of numerous sites about the circuit board for the purpose of enabling measurements of electrical resistance affected by the cleanness of the circuit board. Electrical resistance measurements are made after the completion of manufacturing operations and/or assembling operations involving the circuit board.

To carry out the method of measuring the electrical resistance of the present invention, the circuit shown in FIG. 1 includes a plurality of test voltage supplies 20, 22 and 24 coupled through switches 20A, 22A and 24A to a bus bar 26. By way of an example only, a test voltage supply 20 can be at a potential of 500 volts, voltage supply 22 at a potential of 100 volts and voltage supply 24 at a potential of negative 48 volts. Switches 20A, 22A and 24A are each controlled by a signal supplied from a central processing unit (CPU) identified in FIG. 1 by reference numeral 28. A selected one of the voltage supplies is applied through an operation of the appropriate switch through operation of the CPU to the bus bar 26 where the test current is delivered through resistors 30A, 30B ... 30Z to individual input terminal leads of a test patterns identified by lead 12 of each test pattern. The resistors 30A, 30B ... 30Z form an important function according to the present invention. Namely, to limit the current in the event a given test coupon is shorted by a unwanted conductive path between leads 16 and 18 (FIG. 2) so that the measurement of the remaining test coupons remains unaffected by the shunt. The test voltage is applied through operation of switch 20A to all the test coupons, via the bus bar, as part of a high voltage circuit at times selected through the operation of the CPU. At other times according to the preferred embodiment of the present invention there may be applied to the bus bar a bias voltage by operation of switch 22A or 24A.

The connector leads 14 of the test coupons form input leads 32A, 32B ... 32Z to low current measurement circuits that include converters 34A, 34B ... 34Z, respectively. Each convertor preferably takes the form of an operational amplifier 36 having one input leg 37 grounded while the other input leg 38 receives the input signal as shown. The operational amplifier functions, according to the present invention, to isolate the high voltage circuit by converting the low leakage current signal from the test coupon at the input of the amplifier to a low voltage measurement signal. Each operational amplifier has a feedback path that includes parallel resistors 40 and 42 connected to the feedback path by switches 44 and 46 by operation of the CPU 28 to select the appropriate gain of the amplifier. A capacitor 48 is coupled in a separate feed back path with the resistor to suppress noise.

According to the present invention, the low leakage current from the surface of insulation resistance is first converted to a voltage using an operational amplifier which is selected to form a very high input impedance. The output impedance of the amplifier is of very low ohmic value so that when a leakage current is converted to a voltage it is also transformed from a high impedance circuit to a low impedance circuit and from a high voltage circuit, namely 500 volts DC test circuit or biased voltages of some lesser value, to a low voltage circuit normally of only 10 millivolts to 5 volts DC. The low voltage circuit most advantageously provides that the leakage current from open relay contacts or solid state analogue multiplexer switch is negligible.

As shown in FIG. 1, it can be seen that the output of amplifier 36 is applied through a switch 50, preferably an analog switch, to a bus bar 52 which is coupled to an analog to digital converter 54. The present invention permits for the first time the use of analog switches for multiplexing signals corresponding to very high insulation resistance. This gives the great advantage of reliability, speed of switching and low cost. The analog switches are useable because the outputs of the converters, i.e., operational amplifiers, have low voltage (e.g., 5 millivolts up to 5 volts) and low output resistance (e.g., less than 1 ohm to 10 ohms) such that the leakage current from the open analog switch is negligible. The switch 50 at the output of each of the operational amplifier of converters 34A, 34B ... 34Z is controlled through the operation of a CPU 28 and processed by the analog to digital converter 54 and the CPU 28. The CPU further includes controllers that operate switches 20A, 22A and 24A for determining timed occurrence and intervals when various voltages are applied to the test coupon. The CPU program also compensates for the electrical effect of the series resistance of each of the resistors 30A, 30B ... 30Z, etc. on the computed insulation resistance of the specimen. Other input values to the CPU are made according to the applied voltages as well as the voltage setting resistors in the feedback path for the operational amplifiers. The CPU unit computes measurement values that can be determined to a far greater degree of accuracy than by known circuitry. The accuracy of the measurements can be expected to be better than 3% of the measured value, e.g., resistance values that can vary from $10^6$ to $10^{12}$ ohms. To improve accurately of the measurement of the insulation resistance, it is also desirable to apply suitable shielding to the current output leads that couple the coupon to the input leg of the operational amplifier forming a converter.

Further advantages of the circuitry of the present invention provide that the high test voltage is applied to all test coupons at the same time for 1 or 2 minute as required by various test methods. Then all the channels are scanned in a few seconds by a multiplex operation of analog switches 50. This reduces the test cycle time for a 100 channel system from 3 hours to about 2 minutes. The affect of leakage from shorted test coupons is eliminated from adjacent channels under measurement.

Open contact resistance of a multiplexer relay or analog switch has negligible effect on the actual measurement. The output from the CPU is fed to a convenient display device 56 that may include a printer.

A further example of a test coupon includes leads 60 and 62 each joined with a bus bar 60A and 62A, respectively. Bus bar 60A is joined with conductor leads 60B and bus bar 62A is joined to conductor leads 62B. Leads 60B and 62B have a comb-like configuration that are interleaved so that the electrically resistive material existing between each lead 60B and an adjacent lead 62B takes the form of a resistor that can undergo tests according to the method and apparatus of the present invention. In this regard the input lead 60 will be connected in the circuit in the same manner as the lead for test coupon 10A. The circuitry of the present invention is equally useful for any of numerous test patterns, a further example of which is shown in FIG. 4.

Figure 4:
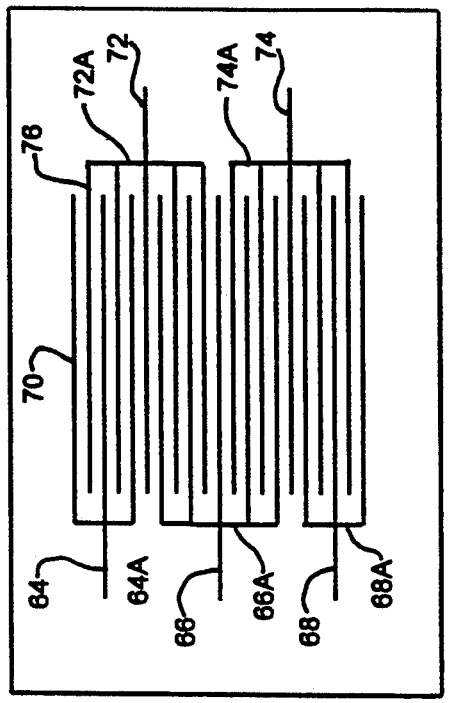
FIG. 4 is a four segment test pattern utilizing interleaving comb segments grouped and coupled together by bus bars for resistance measurements.
Figure 3:
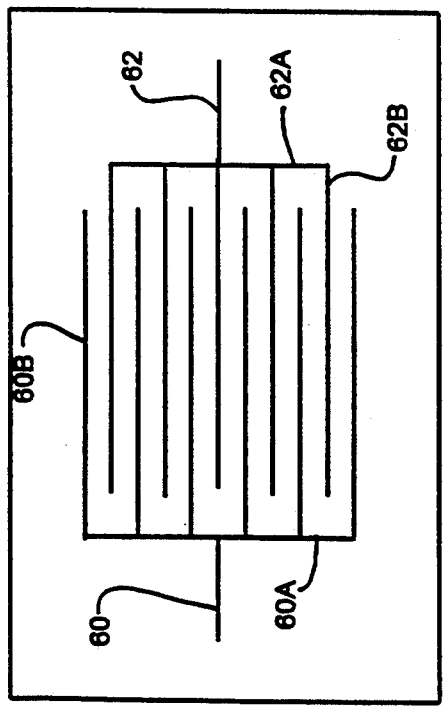
FIG. 3 is a test pattern utilizing interleaving comb segments for the electrical measuring according to the circuitry of FIG. 1.
Figure 5:
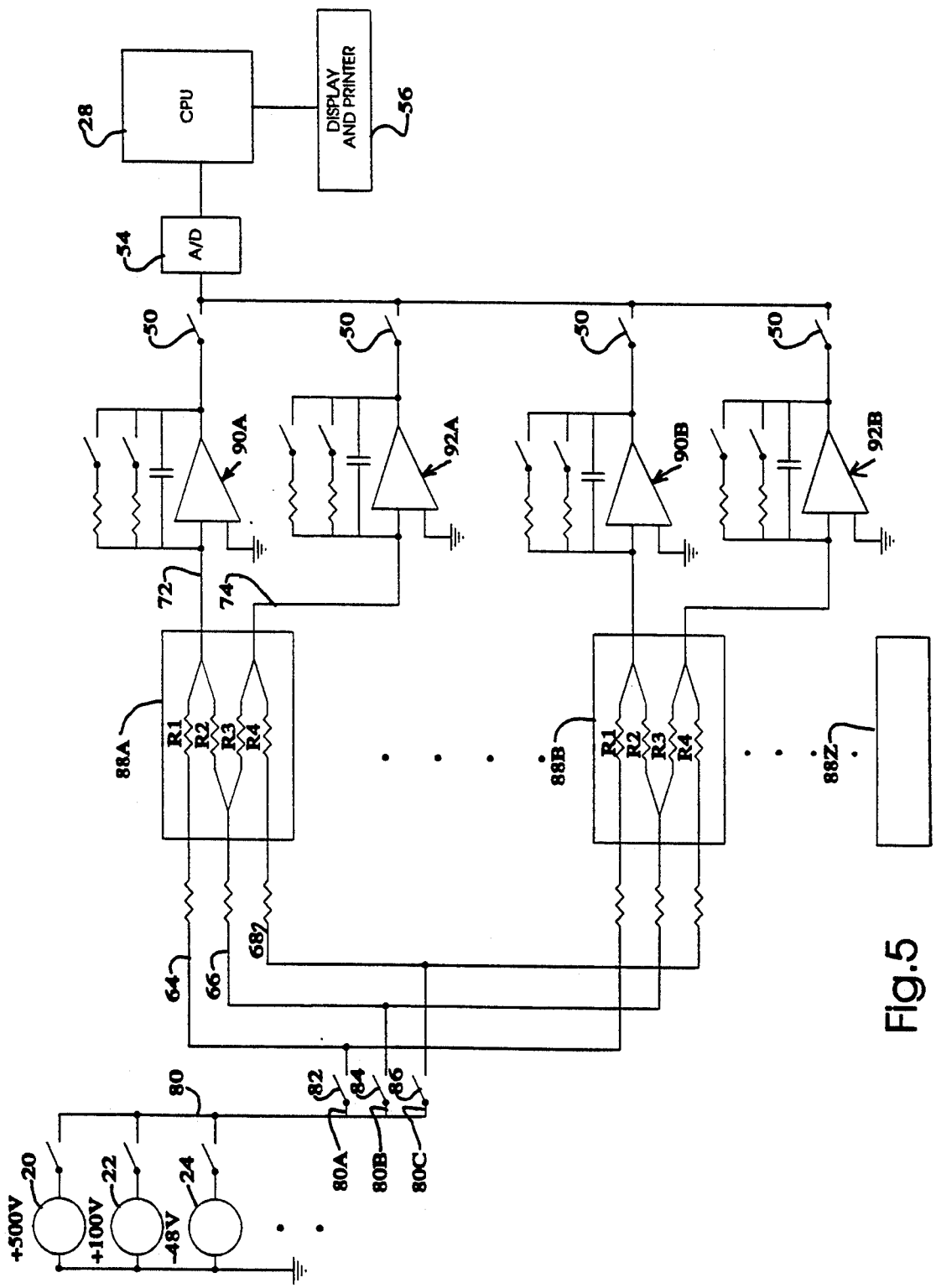
FIG. 5 is the modified form of the electrical circuit similar to the circuit of FIG. 1.

In the test pattern of FIG. 4, leads 64, 66 and 68 are all input leads each joined with corresponding bus bars 64A, 66A and 68A, respectively. Each of these bus bars are electrically connected to a comb-like pattern of conductors 70. The output of the test pattern of FIG. 4 is obtained from leads 72 and 74 joined to bus bar segments 72A and 74A, respectively. The bus bar segments 72A and 74A each support a comb-like arrangement of conductors 76. Unlike the test patterns exemplified in FIGS. 2 and 3, the test pattern of FIG. 4 allows multiple use of leads 76 for measuring electrically resistive material separating the lead from a lead 70. The test pattern of FIG. 4 will be examined using the circuit and the method of the present invention in which a modification of the circuit is made and as illustrated in FIG. 5, it can be seen that a test voltage from a voltage source 20 is supplied to a bus bar 80. The test voltage is supplied to three branch lines 80A, 80B and 80C having switches 82, 84 and 86, respectively. When switch 82 is closed, the test voltage is applied to conductor leads 64 of the test coupon shown in FIG. 4. Moreover, by a parallel arrangement of conductor leads, each of a plurality of coupons is connected by leads 64 to the test voltage. Thus, in FIG. 5 it can be seen that test coupon 88A, 88B . . . 88Z are each simultaneously coupled to the test voltage so that an output is derived by conductor lead 72 from each coupon. The output is a measurement of the circuit equivalent R1 of a resistor comprised of a resistive material between a conductor 70 and a conductor 76. The current output from lead 72 is applied to an input leg of a converter 90A. The converter 90A is identical with and operates in the same manner as described hereinbefore with regard to converters 34A, 34B . . . 34Z.

Thus, it can be seen also in FIG. 5 that a converter 90B receives the output signal from test coupon 88B and operates to convert the leakage current to a voltage for measurement and processing by the CPU. The CPU operates to open switch 82 and close switch 84 thereby applying the test voltage to input lead 66 of each of the test coupons 88A, 88B . . . 88Z. In this instance, however the resistive material under examination exists between a lead 70 coupled to bus bars 66 and a lead 76 coupled to bus bar 72A as well as a lead 70 coupled to bus bar 66A and a lead 76 coupled to bus bar 74A. Thus as shown in FIG. 5, it can be seen that the resistive material under examination is existing between the different leads for the bus bars as described forms resistors equivalence R2 and R3 which are examined by first with respect to R2 supplying the low current output by conductor 72 to the converter 90A and converted thereby to a low voltage. Simultaneously, the circuit equivalent of resistor R3 is measured as an output of conductor 74 as a low current input to a input leg of a converter 92A. Similarly, with respect to test coupon 88B, there is a converter 92B and for each of any number of test coupons there is an associated converter 92Z.

Through the operation of the CPU, switch 84 can be moved to the open position to remove the test voltage from lead 66 and switch 86 closed to apply the test voltage to lead 68 of each of the test coupons 88A, 88B . . . 88Z. When this occurs, electrical resistance afforded by insulation between leads 70 coupled to bus bar 68A and leads 76 coupled to bus bars 74A come under examination with the circuit equivalent with resistor R4 and provides at an output coupon in lead 74 a low current input to converter 92A, 92B . . . 92Z associated with the respective coupons.

In view of the foregoing, it can be seen that test voltages can be applied from corresponding voltage sources as either a high voltage test or as part of a programmed aging testing process using low voltage. During the testing procedure the test voltage can be applied simultaneously to a multiplicity of test coupons and their output supplied simultaneously to corresponding converters. The output from converters is examined through the operation of CPU controlled switches to sequentially derive output signals that are processed by the CPU. At other times, the test voltages can be applied sequentially to a series of coupons as described with regard to FIG. 5 hereinbefore. Moreover, such a sequential operation of test voltages can be applied, for example, to the test coupon configuration of FIG. 2 where dicta compel such a testing sequence. During the testing procedure, it is also desirable to apply suitable shielding to the current output leads that couple the coupon to the input leg of the operational amplifier forming a converter.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

I claim:

1. A method for measuring the electrical resistance of insulation, said method including the step of:
    electrically coupling each of a plurality of electrical insulation specimens to a preselected test voltage and individually to one of a plurality of convertors having a very high input impedance for producing low voltage outputs having very low output impedances, said low output voltage varying in response to a leakage current whereby a voltage appearing at the output of a given converter varies as a function of the leakage current by the test specimen coupled thereto,
    using said very low output impedances to isolate the leakage currents from one another as a function of switching the low voltage outputs of the plurality convertors, and
    establishing from the switched voltage output from each convertor a measure of the leakage current corresponding to the electrical resistance of the respective electrical insulation specimens at said preselected test voltage.

2. The method according to claim 1 further including the step of limiting the current applied to each electrical insulation specimen at said test voltage electrical potential.

3. The method according to claim 1 including the further step of selecting an operational amplifier to form said converter, said amplifier having the feedback path including a resistor for establishing a gain for the amplifier.

4. The method according to claim 3 wherein the feedback for said amplifier includes switching for coupling one of a plurality of resistors to provide a predetermined gain for the amplifier.

5. The method according to claim 3 wherein said feedback path includes filtering to eliminate noise in the voltage appearing at the output of the converter.

6. The method according to claim 1 wherein said step of electrically coupling includes switching one of a plurality of electrical sources each defining a test potential to each of said plurality of electrical insulation specimens.

7. The method according to claim 1 including the further step of computing the electrical resistance of the respective specimens using said switch voltage output.

8. The method according to claim 1 wherein each of the plurality of insulative specimens is simultaneously coupled electrically to the test voltage.

9. The method according to claim 1 wherein said step of switching the outputs includes sequentially multiplexing the outputs of said plurality of converters.

10. The method according to claim 9 wherein said sequential multiplexing includes using analog switching.

11. An apparatus for measuring the electrical resistance of specimens of electrical insulation, said apparatus including:
means for applying a preselected test voltage to each of a plurality of test specimens,
a converter having a very high impedance input electrically coupled to each one of a plurality of the test specimens for generating an output voltage signal as a function of that varies in response to a leakage current input, said output voltage having a very low impedance,
a switch for the very low impedance output of each of said converts to electrically isolate the leakage currents while allowing individual measurement of each very low impedance output voltage signal switching by said switch, and
means responsive to each switched output voltage signal from each switch for establishing a leakage current measurement corresponding to the electrical resistance of the respective electrical insulation specimens at said preselected test voltage.

12. The apparatus according to claim 11 wherein said means for applying a test voltage includes a resistor for limiting the current of the test voltage.

13. The apparatus according to claim 11 wherein said converter includes an operational amplifier.

14. The apparatus according to claim 13 wherein said operational amplifier includes a feedback path having means for establishing the gain of the operational amplifier.

15. The apparatus according to claim 16 wherein said operational amplifier includes a feedback path having means for suppressing noise in an output signal from the operational amplifier.

16. The apparatus according to claim 11 wherein said means for applying a test voltage with electrical potential includes a bus bar electrically coupled to simultaneously apply said test voltage electrical potential to all of said plurality of test specimens.

17. The apparatus according to claim 11 wherein said switch includes an analog switch.

18. The apparatus according to claim 11 wherein said switch includes multiplex analog switches.

* * * * *